US005778638A

United States Patent [19]
Watanabe et al.

[11] Patent Number: 5,778,638
[45] Date of Patent: Jul. 14, 1998

[54] PROCESS FOR PRESERVING SOLDER PASTE

[75] Inventors: Hideaki Watanabe; Takayuki Watanabe, both of Tokyo, Japan

[73] Assignee: Mitsubishi Gas Chemical Company, Inc., Tokyo, Japan

[21] Appl. No.: 797,969

[22] Filed: Feb. 12, 1997

[30] Foreign Application Priority Data

Mar. 6, 1996 [JP] Japan .................................. 8-049028

[51] Int. Cl.⁶ .............................. B65B 31/02; B65B 31/04
[52] U.S. Cl. ........................... 53/432; 53/403; 53/510; 53/400
[58] Field of Search ..................... 53/432, 403, 510, 53/111 RC, 474, 400, 401, 402; 206/205, 204

[56] References Cited

U.S. PATENT DOCUMENTS

| | | | |
|---|---|---|---|
| 4,192,773 | 3/1980 | Yoshikawa et al. | 206/205 |
| 4,637,197 | 1/1987 | Banfield | 53/474 |
| 4,759,490 | 7/1988 | Ochiai | 228/124 |
| 5,143,763 | 9/1992 | Yamada et al. | 206/204 |
| 5,267,646 | 12/1993 | Inoue et al. | 206/205 |
| 5,328,522 | 7/1994 | Sowa et al. | 148/23 |
| 5,378,428 | 1/1995 | Inoue et al. | 206/204 |
| 5,391,322 | 2/1995 | Mayeaux | 206/204 |
| 5,551,557 | 9/1996 | Brooks et al. | 206/205 |

FOREIGN PATENT DOCUMENTS

| 0 454 437 | 10/1991 | European Pat. Off. |
|---|---|---|
| 0 574 161 | 12/1993 | European Pat. Off. |

*Primary Examiner*—James F. Coan
*Assistant Examiner*—Gene L. Kim
*Attorney, Agent, or Firm*—Frishauf, Holtz, Goodman, Langer & Chick, P.C.

[57] ABSTRACT

There is disclosed a process for preserving solder paste which comprises housing solder paste in a vessel which is substantially free from oxygen and moisture and is imparted with gas barrier properties. The process is preferably carried out by housing the solder paste together with an oxygen absorbent not requiring moisture for absorbing oxygen (e.g. unsaturated fatty acid compound and chain hydrocarbon polymer having unsaturated groups) and optionally a dehumidifying agent and/or an acidic gas absorbent in the above vessel and subsequently hermetically sealing said vessel. The process makes it possible to prevent the deterioration of the solder paste such as viscosity change of the solder and the formation of solder balls which affect the printability and solder reflowability, to preserve the solder paste at room temperature and to remarkably prolong its service term.

14 Claims, No Drawings

PROCESS FOR PRESERVING SOLDER PASTE

BACKGROUND OF THE INVENTION

1. Field of the Invention

The present invention relates to a process for preserving solder paste. More particularly, it pertains to a process for preserving solder paste at room temperature in a qualitatively stable manner by housing the solder in a vessel with gas barrier properties substantially free from oxygen and moisture. Furthermore particularly, it is concerned with a process for preserving solder paste at room temperature in a qualitatively stable manner for a long period of time by housing the solder preferably together with a dehumidifying agent and an oxygen absorbent not requiring moisture for absorbing oxygen in a vessel with gas barrier properties and subsequently hermetically sealing the vessel.

2. Description of the Related Arts

Noteworthy progress has been made in mounting technology in recent years. Specifically there is carried out surface mounting technology for attaching fine-pitch quad flat package (QFP) to a printed circuit board and attaching chip parts to a circuit board at a prescribed position, thus bringing about advancement in the high density mounting year by year.

The surface mounting is exemplified by a printing method by using solder paste which comprises the steps of printing a prescribed pattern on the surface of a printed circuit board by the use of solder paste; loading electronic parts such as QFP; causing the solder to reflow by means of a noncontact system such as thermic rays heating; and soldering the terminals of the electronic parts to the board. Accompanying the marked trend toward miniaturization, lessening weight and high functionalization of electronic parts at the present time, LSI packages that are mounted on a printed wiring board are directed to high density mounting technology with a larger number of pins and a narrower pitch of lead terminals. Accordingly, the printing technology by using solder paste is indispensable technology in the field of electronic machinery and equipment. At present, minimization of lead terminal pitches is tackled so as to decrease a prevailing pitch of 0.5 mm to a smaller pitch of 0.3 mm. In such circumstances, better printability and solder reflowability are eagerly desired.

Solder paste, which is in the form of paste produced by premixing powdery solder, a flux, a solvent and the like, is a material of utmost importance which exerts direct influence upon the quality and reliability of surface mounting. It is classified into a great number of kinds according to the metallic composition of the solder, flux composition and the like, and generally is poor in preservation stability. As a method for preserving such solder paste, there is known a method wherein solder paste is enclosed in a vessel having a little high sealability, which is then stored in a cool dark place at 3° to 10° C. such as a refrigerator. In the case of transporting the solder paste preserved in such a way, it is necessary to transport the same at a low temperature and besides to use in a short period of time, that is, within three months from the date of manufacture, thereby causing extreme inconvenience with regard to its production, preservation and transportation.

As a result of the researches made by the present inventors on the various causes of the poor preservation stability, it has been found that the causes are due to the fact that the solder paste is liable to oxidation and hygroscopic action. Specifically, major problems are that a poor condition in fine printability is caused by the viscosity change due to oxidation, hygroscopic action and/or volatilization of a solvent component and that poor printability is caused by the deterioration of the solder paste such as the short circuit of wiring which deterioration is attributable to the formation of soldering balls (the phenomenon that molten solder in the form of ball is scattered in all directions by its surface tension) at the time of reflowing because of the hygroscopicity of the solder paste or the poor melting due to oxidation of the powdery solder. In addition, since the hygroscopicity of the solder paste exerts an adverse influence to a great extent, in the case of using solder paste which has been preserved as a low temperature (3° to 10° C.), it is necessary to carry out a troublesome step of allowing the solder paste to stand in the enclosed state at room temperature for about one hour to bring back to room temperature in order to prevent the solder from absorbing moisture due to dew condensation. It is desirable from such point of view, to preserve solder paste at room temperature.

The actual circumstance, however, is that there is unavailable a simple convenient process for preserving solder paste capable of effectively preventing the deterioration of a flux and the like due to the hygroscopicity of the solder paste, volatilization of a solvent component and the oxidative deterioration of powdery solder.

SUMMARY OF THE INVENTION

It is a general object of the present invention to provide a process for preserving solder paste capable of preventing the deterioration thereof during its preservation, in particular, a process for preserving it at room temperature.

It is another object of the present invention to provide a process for preserving solder paste at room temperature capable of eliminating a lowering of the printability or reflowability of the solder paste even in the case of employing the solder paste which has been preserved for a long period of time.

Other objects of the present invention will be obvious from the text of the specification hereinafter disclosed.

Under such circumstance, intensive research and investigation were accumulated by the present inventors in order to solve the above-described problems. As a result, it has been found that, for the purpose of achieving the above-mentioned object, it is required to remove both oxygen and moisture contained in an atmosphere of preserving the solder paste, and at the same time, that it is furthermore preferable to house the solder paste along with a dehumidifying agent and an oxygen absorbent not requiring moisture of absorbing oxygen in a vessel having gas barrier properties, which is subsequently hermetically sealed. The present invention has been accomplished on the basis of such finding and information. Surprisingly, it has been made possible to prevent the deterioration of the solder paste, almost eliminate the viscosity change thereof during storage up to the time of printing, suppress the formation of soldering balls at the time of solder reflowing, preserve it at room temperature without being associated with dew condensation and also prolong the service term thereof by virtue of the preservation in the aforesaid atmosphere. In addition, in the case where no problem is caused by the troublesomeness of conditioning at room temperature for the purpose of preventing moisture absorption due to dew condensation, it is expectable to further prolong the service term by the simultaneous use of the conventional process of preservation at a low temperature of from about 3° to 10° C. and the process according to the present invention.

Specifically, the present invention provides a process for preserving solder paste which comprises housing solder paste in a vessel which is substantially free from oxygen and moisture and is imparted with gas barrier properties and subsequently hermetically sealing said vessel.

DESCRIPTION OF PREFERRED EMBODIMENTS

One preferred embodiment of the process according to the present invention is to house solder paste along with an oxygen absorbent not requiring moisture for absorbing oxygen or along with said oxygen absorbent and a dehumidifying agent in a vessel imparted with gas barrier properties, and subsequently hermetically seal the vessel.

Another preferred embodiment of the process according to the present invention is to house solder paste along with an oxygen absorbent not requiring moisture for absorbing oxygen and an acidic gas absorbent or along with said oxygen absorbent, a dehumidifying agent and an acidic gas absorbent in a vessel imparted with gas barrier properties, and subsequently hermetically seal the vessel.

With regard to the atmosphere in which solder paste is preserved, it is necessary to house the solder paste in a vessel which is substantially free from oxygen and moisture and is imparted with gas barrier properties and subsequently hermetically seal the vessel. By the term "substantially free from oxygen" as mentioned herein is meant an oxygen concentration in the vessel of at most 5%, preferably at most 1%, more preferably at most 0.1%. By the term "substantially free from moisture" as mentioned herein is meant a relative humidity in the vessel of at most 10%, preferably at most 5%, more preferably at most 1%.

In the case where the oxygen concentration and the relative humidity are each higher than 5% and 10%, respectively, the oxidation of powdery components in the solder paste, deterioration of the flux due to moisture absorption and volatilization of solvent components give rise to viscosity change of the solder paste during its storage up to the time of printing, soldering balls at the time of solder reflowing and the like. As a result, the printability of the solder paste and the solder reflowability are deteriorated, whereby the solder paste no longer stands the service.

In the process according to the present invention, various methods can be taken into consideration in order to respond to the necessity for substantially removing oxygen and moisture in the vessel which is imparted with gas barrier properties and used for housing the solder paste. A preferable method among them is a method which comprises housing, together with the solder paste in said vessel, ① an oxygen abosorbent not requiring moisture for absorbing oxygen, ② said oxygen absorbent and a dehumidifying agent, ③ said oxygen absorbent and an acidic gas absorbent, or ④ said oxygen absorbent, a dehumidifying agent and an acidic gas absorbent.

The oxygen absorbent is not specifically limited provided that it does not require moisture for absorbing oxygen, and is exemplified by an oxygen absorbent comprising an unsaturated organic compound such as an unsaturated fatty acid compound and a chain hydrocarbon polymer having an unsaturated group, or a thermoplastic polymer such as polyamide and polyolefin as a principal component, and an oxygen absorption promoting substance such as a transition metal salt. Of these, preferably the oxygen absorbent comprises an unsaturated fatty acid compound and/or a chain hydrocarbon polymer having an unsaturated group as a principal compound, and an oxygen absorption promoting substance.

Examples of the unsaturated fatty acid compound to be used as an oxygen absorbent include an unsaturated fatty acid preferably having at least 10 carbon atoms, particularly preferably having from 10 to 30 carbon atoms as well as a double bond between carbon atoms, a salt of said unsaturated fatty acid and an ester thereof. The above-mentioned unsaturated fatty acid, a salt thereof and an ester thereof may each have a substituent group such as hydroxyl group and formyl group. The aforesaid unsaturated fatty acid compound may be employed alone or in combination with at least one other to form a mixture.

Examples of the foregoing unsaturated fatty acid compound include an unsaturated fatty acid such as oleic acid, linoleic acid, linolenic acid, arachidonic acid, parinaric acid, dimer acid and ricinoleic acid, an ester thereof, a metallic salt thereof, and a fat and oil each containing said ester.

As the usable unsaturated fatty acid, mention is also made of a fatty acid produced from any of an animal oil and a vegetable oil such as linseed oil, soybean oil, tung oil, bran oil, sesame oil, cottonseed oil, rapeseed oil and tall oil.

In addition, examples of the aforesaid chain hydrocarbon polymer having an unsaturated group include a polymer preferably having at least 10 carbon atoms, particularly preferably having from 100 to 1000 carbon atoms as well as at least one double bond between carbon atoms and a derivative thereof. The derivative may have a substituent group such as hydroxyl group, amino group, formyl group and carboxyl group. The chain hydrocarbon polymer having an unsaturated group is specifically exemplified by an oligomer and a polymer of any of butadiene, isoprene and 1,3-pentadiene, and is not limited to single compound, but may be a copolymer or in the form of a mixture of at least two polymers. The chain hydrocarbon polymer having an unsaturated group is not necessarily required to be pure, but is permitted to contain, within a reasonable limit, a small amount of impurities such as a solvent which is possibly mixed therein at the time of its production.

The aforementioned oxygen absorption promoting substance is exemplified by a metallic salt and a radical initiator each promoting the oxidation of an organic compound. As the metallic salt, there is preferably usable a salt of a transition metal such as Cu, Fe, Co, Ni, Cr and Mn. As the salt of a transition metal, there is preferably usable an unsaturated fatty acid salt of a transition metal.

In the case where the principal component in the oxygen absorbent is in the form of a liquid, it is preferable to employ an adsorptive substance as a carrier substance, which is exemplified by paper made of natural pulp, synthetic paper made of synthetic pulp, silica-gel, alumina, activated carbon, zeolite including natural zeolite and synthetic zeolite, perlite and activated clay. It is also practical use to select the carrier substance from the substances that are selected as a dehumidifying agent or an acidic gas absorbent to impart dehumidifying or acidic gas absorbing performance to the carrier substance.

The proportion of each of the components in the oxygen absorbent is not specifically limited, but may be suitably determined according to various situations. Preferably the oxygen absorption promoting substance is contained in an amount of from 0.01 to 40 parts by weight based on 100 parts by weight of the principal component, and the carrier substance is contained in an amount of from 1 to 1000 parts by weight based on the same.

The dehumidifying agent to be used in the process according to the present invention is exemplified by paper made of natural pulp, synthetic paper made of synthetic pulp, silica-gel, alumina, activated carbon, zeolite including natural zeolite and synthetic zeolite, perlite, activated clay, quick lime, barium oxide, calcium chloride, barium bromide, calcium hydroxide, calcium sulfate, magnesium chloride, magnesium oxide, magnesium sulfate, aluminum sulfate, sodium sulfate, sodium carbonate, potassium carbonate and zinc chloride. The dehumidifying agent may be used alone or in combination with at least one other to form a mixture. The above-mentioned carrier substance or acidic gas absorbent, when selected from substances imparted with a dehumidifying function, makes it unnecessary to freshly incorporate a dehumidifying agent.

The acidic gas absorbent to be used in the process according to the present invention needs only be a substance capable of absorbing or adsorbing an acidic substance present in the hermetically sealed atmosphere without specific limitation, and is exemplified by paper, synthetic paper, a synthetic resin, porous material such as zeolite including natural zeolite and synthetic zeolite, and activated carbon, an oxide, hydroxide, carbonate or organic acid salt of an alkali metal or an alkaline earth metal, and an organic amine. The acidic gas absorbent may be used alone or in combination with at least one other to form a mixture. The aforesaid carrier substance or dehumidifying agent, when selected from substances imparted with acidic gas absorbing function, makes it unnecessary to freshly incorporate an acidic gas absorbent.

The amount of the oxygen absorbent to be used in the process according to the present invention may be suitably selected without specific limitation. It is preferably an amount capable of absorbing at least the oxygen in the space volume of a hermetically sealed vessel having gas barrier properties, more preferably an amount 1.1 to 10 times the said amount. Likewise, the amount of the dehumidifying agent to be used therein may be suitably selected without specific limitation in accordance with the gas barrier performance of the hermetically sealed vessel having gas barrier properties. It is preferably an amount capable of absorbing at least the moisture in the space volume of the aforesaid vessel, more preferably an amount 1.1 to 500 times the said amount.

It is possible in the process according to the present invention to use the oxygen absorbent, dehumidifying agent and acidic gas absorbent each individually or as a mixture with one another in the form of powder, granule, tablet, sheet or the like in accordance with the situations. It is unfavorable to bring any of the oxygen absorbent, dehumidifying agent and acidic gas absorbent into direct contact with the material to be preserved in the vessel. Accordingly, it is usually used in the form of package in which the absorbent or the agent is packed with a well known air permeable packing material composed of, for example, paper or nonwoven fabric as a base material. The oxygen absorbent may be packed in part or in whole along with either or both of the dehumidifying agent and the acidic gas absorbent, or may be individually packed. The package is not specifically limited in its form, packaging material and constitution, but may be in the form of small bag, sheet or blister (bubble) package according to the purpose of use. In addition, it is possible as a dust-proof measure to duplicate the package by further covering the aforementioned package with a dust-proof packaging material which does not hinder the permeability of oxygen, moisture and acidic gas nor discharge the dust generated from the package outside the duplicate package. However, in the case where dust-proof measure is taken for the package itself, the package need not be covered with a dust-proof packaging material.

In the case of long-term preservation of the solder paste in the hermetically sealed vessel which has gas barrier properties and is used for the process according to the present invention, it is preferable that said vessel be enhanced in gas barrier properties and made of plastics, film bag, metal, glass or the like, since there is no denying that oxygen and/or steam permeate and penetrate into the vessel during the preservation period, thereby increasing the concentrations of oxygen and moisture in the vessel. With regard to a film bag as an example, there is usable a material having poor gas barrier properties such as polyethylene, polypropylene and nylon thread, provided that the preservation period of time is relatively short. On the other hand in the case of long-term preservation, there is need for the use of a material enhanced in gas barrier properties such as aluminum foil and silicon oxide vapor deposited material. The value of the gas barrier properties of the hermetically sealed vessel having gas barrier properties, although depending upon the working conditions, is usually preferably 10 mL (milliliter)/m$^2$·day·atm or less expressed in terms of oxygen permeability at 25° C., 60% RH (relative humidity) and 1 g/m$^2$·day or less expressed in terms of water vapor transmission rate at 40° C., 90% RH. At the time of preserving the solder paste in the vessel by hermetically sealing the vessel, the atmosphere in the vessel may be replaced with a dry inert gas such as nitrogen and argon, as the replacement with the gas preferably leads to a decrease in the use amounts of the oxygen absorbent and dehumidifying agent, especially the amount of the oxygen absorbent.

The temperature of the preservation environment is usually 0° to 50° C., preferably 10° to 40° C., more preferably 20° to 30° C. When the environmental temperature at which the printing work with the solder paste is carried out is within the aforesaid range, there is preferably no fear of causing dew condensation. In the case where no problem is caused by the troublesomeness of conditioning at room temperature for the purpose of preventing moisture absorption due to dew condensation, it is expectable to further prolong the service term by the simultaneous use of the conventional process of preservation at a low temperature of from about 3° to 10° C. and the process according to the present invention.

According to the process of the present invention, it has been made possible to prevent the deterioration of the solder paste such as viscosity change of the solder paste and the formation of soldering balls which affect the printability and solder reflowability, to preserve the solder paste at room temperature and at the same time, to prolong the service term thereof by preserving the solder paste in the atmosphere almost free from oxygen and moisture. It has also been made possible to satisfactorily preserve the solder paste by a simple convenient method in which the solder paste is housed in a vessel having gas barrier properties along with an oxygen absorbent not requiring moisture for absorbing oxygen and a dehumidifying agent and preferably further with an acidic gas absorbent and then the vessel is hermetically sealed.

In the following, the present invention will be described in more detail with reference to comparative examples and working examples, which however, shall not limit the present invention thereto.

EXAMPLE 1

(Preparation of gas absorbent package)

A gas absorbent package (hereinafter referred to simply as "gas absorbent") was prepared by mixing 5 g of an oxygen absorbent, a dehumidifying agent and 2.5 g of quick lime as an acidic gas absorbent; packing the resultant mixture in a small paper bag of 5 cm by 7.5 cm in inside dimension laminated inside with a polyethylene film having an open end; and covering the packed gas absorbent with a dust-proof packaging material which maintains or does not much hinder the permeability of oxygen and moisture, said oxygen absorbent had been prepared by mixing 100 parts by weight of soybean oil as an unsaturated organic compound, namely a principal component and 2 parts by weight of cobalt naphthenate as an oxygen absorption promoting substance having a cobalt content of 8% by weight to form a mixture, adding 350 parts by weight of natural zeolite (mordenite) to the resultant mixture, blending the three components with a blender to form a blend and allowing the resulting blend to stand at 25° C. for 10 minutes to produce powdery particles having fluidity.

(Preservation of solder paste)

In a packaging bag of 220 mm by 300 mm in size made of an aluminum foil-based laminated material (oriented polypropylene/aluminum foil/polyethylene) (hereinafter referred to as "aluminum bag") were placed one plastics container containing 500 g of solder paste consisting of MICROSOLDER (produced by Harima Chemicals, Inc. under the trade name PSI10BR-450A-F60), one pack of the above-prepared gas absorbent and 500 mL (milliliter) of air at 25° C., 75% RH. Then, the aluminum bag housing the solder paste along with the gas absorbent and air was hermetically sealed by thermally sealing the open end of the bag, and thereafter was allowed to stand for 5 months in an atmosphere at 25° C. and 60% RH. After the lapse of 5 months of preservation, a measurement was made of the concentrations of the oxygen and moisture in the aluminum bag by means of gas chromatography. As a result, it was confirmed that the preservation system had been maintained in a state substantially free from oxygen and moisture.

(Evaluation of solder paste)

The above-preserved solder paste was taken out from the aluminum bag by unsealing the bag, and evaluations were made of the situation of soldering balls occurrence from the solder paste as well as the viscosity of the preserved solder paste. The soldering balls were tested in accordance with JIS Z 3284 by a method comprising the steps of placing a metallic mask of 25 mm by 50 mm by 0.2 mm in size having a hole of 6.5 mm in diameter in the center on an alumina base plate of 25 mm by 50 mm by 0.8 mm in size; printing the plate with the solder paste by using a spatula; horizontally placing the plate from which the mask was removed, on the surface of a solder bath in liquid at 235° C.; melting the printing solder paste; taking out the plate after 5 seconds from the melting while maintaining horizontal state; allowing the plate to cool until the solidification of the solder paste; and evaluating the occurrence degree of soldering balls. The result of evaluation was classified into 5 grades, including, in the deteriorating order, |1| being excellent due to absence of soldering balls on the surroundings, |2|, |3|, |4|, and |5| being poor due to the occurrence of a number of soldering balls and the degree of soldering balls coagulation on the surroundings. The viscosity of the solder paste at 25° C. was measured by the use of a Brookfield rotational viscometer (produced by Tokimeck Co., Ltd.). The solder paste prepared in the Example 1 before the preservation test was subjected to the evaluation test in the same manner as in Example 1 in order to confirm its initial state as the reference. The results are given in Table 1. With respect to the evaluation on the occurrence degree of soldering balls and the degree of soldering balls coagulation, Example 1 was marked as |1|, since the solder became only one large ball without causing confirmable soldering balls on the surroundings as is the case with the initial state before the preservation test. Likewise, the viscosity change of the solder after the preservation test was slight in its increase as compared with the initial state.

COMPARATIVE EXAMPLE 1

The solder paste same as that used in Example 1 was allowed to stand for 5 months in a dark atmosphere at 10° C. which has heretofore been the recommendable preservation temperature, instead of being housed in a hermetically sealed vessel having gas barrier properties, and was subjected to the evaluation test in the same manner as in Example 1. The results are given in Table 1.

As a result, different form the initial state before the preservation test, the occurrence of soldering balls was confirmed in not less than three numbers. Hence, the degree of solder coagulation was marked as |3|, whereby the deterioration of the solder paste was confirmed. Likewise, appreciable viscosity change of the solder paste after the preservation test was confirmed in its increase as compared with the initial state.

COMPARATIVE EXAMPLE 2

The solder paste same as that used in Example 1 was allowed to stand for 5 months in a dark atmosphere at 10° C. and a relative humidity (RH) of 60%, instead of being housed in a hermetically sealed vessel having gas barrier properties, and was subjected to the evaluation test in the same manner as in Example 1. The results are given in Table 1.

As a result, different from the initial state before the preservation test, the occurrence of soldering balls was confirmed in numerous numbers forming semi-continuous soldering balls in annular form. Hence, the degree of solder coagulation was marked as |4|, whereby the deterioration of the solder paste was confirmed. Likewise, appreciable viscosity change of the solder paste after the preservation test was confirmed in its increase as compared with the initial state.

TABLE 1

|  | Initial value | Example 1 | Comparative Example 1 | Comparative Example 2 |
| --- | --- | --- | --- | --- |
| Procedure | Initial state (state before preservation test) | Preserved together with gas absorbent of the present invention in hermetically sealed gas barrier vessel | Preserved as such without being enclosed in gas barrier vessel | Preserved as such without being enclosed in gas barrier vessel |

TABLE 1-continued

|  | Initial value | Example 1 | Comparative Example 1 | Comparative Example 2 |
| --- | --- | --- | --- | --- |
| Preservation temperature (°C.) Bag inside after 5 months | — | 25 | 10 | 25 |
| oxygen concentration (%) | — | 0.03 | — | — |
| relative humidity (% RH) | — | <1 | — | — |
| Occurrence of a number of soldering balls and degree of soldering ball coagulation (JIS Z 3284) | 1 | 1 | 3 | 4 |
| Viscosity (mPa · s) | 210,000 | 215,000 | 240,000 | 270,000 |

EXAMPLES 2 TO 4

The procedure in Example 1 was repeated to prepare gas absorbents except that the combinations of the principal component of the oxygen absorbent and the oxygen absorption promoting substance in the gas absorbent in Example 1 were each altered as follows.

|  | Principal component in oxygen absorbent (100 parts by weight) | Oxygen absorption promoting agent (2 parts by weight) |
| --- | --- | --- |
| Example 1 | soybean oil | cobalt naphthenate |
| Example 2 | fatty acid from tall oil | cobalt salt of fatty acid from tall oil 2) |
| Example 3 | soybean oil | cobalt salt of fatty acid from tall oil |
| Example 4 | soybean oil + liquid polyisoprene 1) | cobalt naphthenate |

Remarks
1) mixture of soybean oil and liquid polyisoprene (produced by Japan Synthetic Rubber Co., Ltd. under the trade name of Dynaclean R 113) at a ratio by weight of 6:4
2) cobalt salt of fatty acid from tall oil (cobalt content of 6% by weight)

By the use of each of the gas absorbents as listed above having different combination from one another in the principal component of the oxygen absorbent and the oxygen absorption promoting substance, there were carried out preservation tests and evaluation tests of the solder paste in the same manner as in Example 1. The results are given in Table 2.

TABLE 2

|  | Example 1 | Example 2 | Example 3 | Example 4 |
| --- | --- | --- | --- | --- |
| Oxygen absorbent organic compound (principal component | Soybean oil | fatty acid from tall oil | soybean oil | soybean oil + liquid polyisoprene |
| oxygen absorption promoting substance Bag inside after 5 months | cobalt naphthenate | cobalt salt of fatty acid from tall oil | cobalt salt of fatty acid from tall oil | cobalt naphthenate |
| oxygen concentration (%) | 0.03 | 0.03 | 0.04 | 0.03 |

TABLE 2-continued

|  | Example 1 | Example 2 | Example 3 | Example 4 |
| --- | --- | --- | --- | --- |
| relative humidity (% RH) | <1 | <1 | <1 | <1 |
| Occurrence of a number of soldering balls and degree of soldering ball coagulation (JIS Z 3284) | 1 | 1 | 1 | 1 |
| Viscosity (mPa · s) | 215,000 | 215,000 | 220,000 | 215,000 |

COMPARATIVE EXAMPLES 3

The procedure in Example 1 was repeated to carry out the evaluation test for the solder paste except that there was used 5 g of a desiccating agent (silica-gel type A, produced by Fuji Devidson Chemical Co., Ltd.) in place of the gas absorbent. The results are given in Table 3.

COMPARATIVE EXAMPLE 4

The procedure in Example 1 was repeated to carry out the evaluation test for the solder paste except that there was used a deoxidation agent of moisture retention type powdery iron base (produced by Mitsubishi Gas Chemical Co., Inc. under the trade name "Ageless Z-100 PT") in place of the gas absorbent. The results are given in Table 3.

TABLE 3

|  | Initial value | Example 1 | Comparative Example 3 | Comparative Example 4 |
| --- | --- | --- | --- | --- |
| Procedure | Initial state (state before preservation test) | Preserved together with gas absorbent of the present invention in hermetically sealed gas barrier vessel | Preserved together with desiccating agent in hermetically sealed gas barrier vessel | Preserved together with deoxidation agent of moisture retention type powdery iron base in hermetically sealed gas barrier vessel |
| Preservation temperature (°C.) | — | 25 | 25 | 25 |
| Bag inside after 5 months |  |  |  |  |
| oxygen concentration (%) | — | 0.03 | 20.9 | 0.09 |
| relative humidity (% RH) | — | <1 | 5 | 74 |
| Occurrence of a number of soldering balls and degree of soldering ball coagulation (JIS Z 3284) | 1 | 1 | 3 | 4 |
| Viscosity (mPa · s) | 210,000 | 215,000 | 227,000 | 250,000 |

EXAMPLE 5

The procedure in Example 1 was repeated to carry out the evaluation test for the solder paste except that the preservation test was performed in a dry atmosphere of 40° C. for a periods of 2 weeks and four weeks, respectively. The results are given in Table 4.

COMPARATIVE EXAMPLE 5

The procedure in Example 5 was repeated to carry out the evaluation test for the solder paste except that the use of the gas absorbent was omitted. The results are given in Table 4.

TABLE 4

|  | Initial value | Example 5 | | Comparative Example 5 | |
| --- | --- | --- | --- | --- | --- |
| Procedure | Initial state (state before preservation test) | Preserved together with gas absorbent of the present invention in hermetically sealed gas barrier vessel | | Preserved without using gas absorbent in hermetically sealed gas barrier vessel | |
| Preservation temperature (°C.) | — | 40 | 40 | 40 | 40 |
| Preservation term (weeks) |  | 2 | 4 | 2 | 4 |
| Bag inside |  |  |  |  |  |
| oxygen concentration (%) | — | 0.06 | 0.04 | 18.3 | 17.1 |
| relative humidity (% RH) | — | <1 | <1 | 32 | 30 |
| Occurrence of a number of soldering balls and degree of soldering ball coagulation (JIS Z 3284) | 1 | 2 | 2 | 4 | 4 |
| Viscosity (mPa · s) | 210,000 | 225,000 | 245,000 | 295,000 | 350,00 |

What is claimed is:

1. A process for preserving solder paste which comprises:
   (a) housing solder paste together with (i) an oxygen absorbent not requiring moisture for absorbing oxygen, said oxygen absorbent comprising at least one member selected from the group consisting of linseed oil, soybean oil, tung oil, bran oil, sesame oil, cottonseed oil, rapeseed oil, tall oil, a fatty acid produced from any of said oils, polybutadiene having 100 to 1000 carbon atoms, polyisoprene having 100 to 1000 carbon atoms, poly(1,3-pentadiene) having 100 to 1000 carbon atoms, oleic acid, linoleic acid, linolenic acid, arachidonic acid, parinaric acid and ricinoleic acid; and (ii) a dehumidifying agent, in a vessel which is made to be substantially free from oxygen and moistures wherein relative humidity in said vessel is at most 1%, said vessel having gas barrier properties, and (b) subsequently hermetically sealing said vessel.

2. The process according to claim 1, wherein in said vessel the oxygen is in a concentration of at most 0.1%.

3. The process according to claim 1 for preserving solder paste comprising housing further an acidic gas absorbent in said vessel which is made to be substantially free from oxygen and moisture.

4. The process according to claim 1, wherein the vessel housing the solder paste, together with the oxygen absorbent not requiring moisture for absorbing oxygen and the dehumidifying agent further contains an acidic gas absorbent.

5. The process according to claim 1, wherein said vessel further houses an oxygen absorption promoting substance.

6. The process according to claim 5, wherein the oxygen absorption promoting substance is an unsaturated fatty acid salt of a transition metal.

7. The process according to claim 1, wherein in said vessel there is an oxygen concentration of at most 5% and a relative humidity of at most 10%.

8. The process according to claim 1, wherein in said vessel there is an oxygen concentration of at most 10% and a relative humidity of at most 5%.

9. The process according to claim 6, wherein the transition metal is selected from the group consisting of Cu, Fe, Co, Ni, Cr and Mn.

10. The process according to claim 5, wherein the oxygen absorption promoting substance is in an amount of 0.01 to 40 parts by weight based on 100 parts by weight of the oxygen absorbent.

11. The process according to claim 1, wherein the dehumidifying agent is selected from the group consisting of natural pulp, synthetic paper made from synthetic pulp, silica gel, alumina, activated carbon, a natural zeolite, a synthetic zeolite, perlite, activated clay, quick lime barium oxide, calcium chloride, barium bromide, calcium hydroxide, calcium sulfate, magnesium chloride, magnesium oxide, magnesium sulfate, aluminum sulfate, sodium sulfate, sodium carbonate, potassium carbonate and zinc chloride.

12. The process according to claim 3, wherein the acidic gas absorbent is selected from the group consisting of paper, synthetic paper, a synthetic resin, a natural zeolite, a synthetic zeolite and activated carbon.

13. The process according to claim 1, wherein the oxygen absorbent is in an amount of 1.1 to 10 times an amount capable of absorbing the oxygen in the vessel.

14. The process according to claim 1, wherein the process is carried out at a temperature of 0° to 50° C.

* * * * *

UNITED STATES PATENT AND TRADEMARK OFFICE
CERTIFICATE OF CORRECTION

PATENT NO. : 5,778,638
DATED : July 14, 1998
INVENTOR(S) : WATANABE et al

It is certified that error appears in the above-identified patent and that said Letters Patent is hereby corrected as shown below:

Column 13, line 10 (Claim 3): after "paste" insert --further--; after "housing", delete "further".

Signed and Sealed this

Eleventh Day of January, 2000

Attest:

Attesting Officer

Q. TODD DICKINSON

Acting Commissioner of Patents and Trademarks